(12) United States Patent
Shiota et al.

(10) Patent No.: US 6,743,553 B2
(45) Date of Patent: Jun. 1, 2004

(54) HALFTONE PHASE SHIFT MASK AND MASK BLANK

(75) Inventors: Yuki Shiota, Akishima (JP); Osamu Nozawa, Fuchu (JP)

(73) Assignee: Hoya Corporation, Tokyo (JP)

( * ) Notice: Subject to any disclaimer, the term of this patent is extended or adjusted under 35 U.S.C. 154(b) by 96 days.

(21) Appl. No.: 10/025,569

(22) Filed: Dec. 26, 2001

(65) Prior Publication Data

US 2002/0122991 A1 Sep. 5, 2002

(30) Foreign Application Priority Data

Dec. 26, 2000 (JP) .......................... 2000-395982
Nov. 27, 2001 (JP) .......................... 2001-361025

(51) Int. Cl.$^7$ ................................ G03F 9/00
(52) U.S. Cl. .............................. 430/5; 430/311
(58) Field of Search ........................ 430/5, 311

(56) References Cited

U.S. PATENT DOCUMENTS

| 5,477,058 A | 12/1995 | Sato |
| 5,482,799 A | 1/1996 | Isao et al. |
| 5,547,787 A | 8/1996 | Ito et al. |

FOREIGN PATENT DOCUMENTS

| JP | 2-39153 A | 2/1990 |
| JP | 6-83034 A | 3/1994 |
| JP | 6-289589 | 10/1994 |
| JP | 7-104457 | 4/1995 |
| JP | 7-199447 | 8/1995 |
| JP | 7-209849 A | 8/1995 |
| JP | 8-76353 | 3/1996 |
| JP | 8-325560 A | 12/1996 |
| JP | 10-198017 | 7/1998 |
| JP | 2001-56545 A | 2/2001 |
| JP | 2001-66756 A | 3/2001 |
| JP | 2001-174973 A | 6/2001 |

*Primary Examiner*—Christopher G. Young
(74) *Attorney, Agent, or Firm*—Sughrue Mion, PLLC

(57) ABSTRACT

In a phase shift mask blank, a desired transmittance and phase shift amount are given in the vicinity of 157 nm as a wavelength of an $F_2$ excimer laser. The phase shift mask blank has a phase shifter film satisfactory in a resistance to exposure light irradiation, resistance to chemicals, processability, moldability, and shape stability. The halftone phase shift mask blank having the phase shifter on a transparent substrate is used in an exposure light wavelength rage of 140 nm to 200 nm, the phase shifter film is formed of a film containing main constituting elements of silicon, oxygen, and nitrogen, and contains 35 and 45% of silicon, 1 to 60% of oxygen, and 5 to 60% of nitrogen in atomic percentage, and a total amount of the elements occupies at least 90% or more of a whole composition constituting the phase shifter portion.

19 Claims, 3 Drawing Sheets

HALFTONE PHASE SHIFT MASK AND MASK BLANK

BACKGROUND OF THE INVENTION i) Field of the Invention

The present invention relates to a phase shit mask which can enhance a resolution of a transfer pattern by utilizing an interference action caused to occur among light waves in a phase shifter. In particular, the present invention relates to a material of the phase shift mask, and a method of manufacturing the phase shift blank and mask, and more particularly to a halftone phase shift mask, blank, and a method of manufacturing the halftone phase shift mask and blank.

ii) Description of Related Art

For DRAM, a mass production system of 256 Mbits has been established at present, and a higher integration to a gigabit grade from a megabit grade is going to be attempted nowadays. Accordingly, a design rule of an integrated circuit has increasingly been minute. It is a matter of time that a fine pattern with a line width (half pitch) of 0.10 µm or less is demanded.

As one means for handling such a fine pattern, a resolution of the pattern has been improved by shortening a wavelength of an exposure light source. As a result, a KrF excimer laser (248 nm) or an ArF excimer laser (193 nm) is mainly used in the exposure light source in an existing photolithography method.

Although the shortened exposure wavelength improves the resolution, a depth of focus becomes shallow. Therefore, a heavy burden tends to be imposed onto a design of an optical system including a lens, or adverse influences such as deterioration of stability of a process takes place in such a design.

To solve the problems, a phase shift method has been used, in the phase shift method, a phase shift mask is used as a mask for transferring the fine pattern.

The phase shift mask is constituted, for example, of a phase shifter portion that serves as a pattern portion on the mask, and a non-pattern portion in which the phase shifter portion does not exist. A phase of light transmitted through both the portions is shifted by 180° relative to each other, then mutual interference of light, namely, light waves is caused to occur at pattern boundary portions. This is effective to enhance contrast of a transferred image. It is known that a phase shift amount φ (rad) of a light wave passed through the phase shifter portion depends on a real part n of a complex refractive index and a film thickness d of the phase shifter portion and that a relationship of the following equation (1) is established.

$$\phi = 2\pi d(n-1)/\lambda \quad (1)$$

Here, λ denotes a wavelength of an exposure light. Therefore, to shift the phase by 180°, the film thickness d may be set as follows.

$$d = \lambda/\{2(n-1)\} \quad (2)$$

The phase shift mask achieves an increase of the depth of focus for obtaining a necessary resolution, and it is possible to establish both improvement of the resolution and enhancement of applicability of the process without changing the exposure wavelength.

The phase shift mask is practically roughly classified into a perfect transmission (Levenson type) phase shift mask and a halftone phase shift mask in accordance with a light transmission property of the phase shifter portion forming a mask pattern. The former has a transmittance of the phase shifter portion which is equal to that of the non-pattern portion (light transmission portion), and is a mask substantially transparent to the exposure wavelength. It is generally said that the mask is effective for transferring a line and space. On the other hand, in the latter halftone type, the phase shifter portion (light semi-transmission potion or light translucent portion) has a transmittance of about several percentages to several tens of percentages, as compared with the transmittance of the non-pattern portion (light transmission portion). It is said that the halftone type is effective for preparing a contact hole or an isolated pattern.

An example of the halftone phase shift masks includes a single-layer type halftone phase shift mask which is simple in structure and which is easy to manufacture. Such single-layer halftone phase shift masks can be exemplified by $SiO_x$-based and $SiO_xN_y$-based masks described in Japanese Patent Application Laid-Open No. 199447/1995, $SiN_x$-based mask described in U.S. Pat. No. 5,477,058, and the like.

In order to achieve higher integration by the photolithography method in future, even by using the phase shift method, it is still necessary to further shorten the exposure wavelength. As a next-generation exposure light source following the KrF excimer laser and ArF excimer laser, $F_2$ excimer laser (157 nm) has already been tried and investigated. However, shortening the wavelength of the exposure light source imposes the burden onto the optical system as described above, and also brings about difficulty in development/preparation of a photo mask. As a result, development of the halftone phase shift mask for the $F_2$ excimer laser has hardly been started in the present situation. The following will be made about causes of the problems hereinafter.

First in many solid materials, a degree of light absorption increases as the wavelength becomes short. Taking this into account, it is assumed that a transmission film material and a translucent film material which are used in the KrF excimer laser and ArF excimer laser may be applied to the halftone phase shift mask for the $F_2$ excimer laser. In this event, a film should be thick in order to obtain a predetermined phase angle. As a result the transmittance substantially indicates a value close to zero. Moreover, when the degree of absorption of the exposure light is high, the film forming the phase shifter portion is liable to suffer from damages by the exposure light. The damages herein mean changes of optical properties (transmittance, refractive index, and the like) of the film, film thickness change, film properties deterioration, and the like because of a defect generated in the film forming the phase shifter portion by absorption of the exposure light, and a cleavage in a bond.

Additionally, consideration should also be made as a film material of the phase shifter portion about problems, such as etching selectivity of the phase shifter film influencing a processing precision, a chemical durability to acid or alkali used in a cleaning step of a manufacturing process, and the like.

SUMMARY OF THE INVENTION

The present invention has been developed under the aforementioned background, and an object thereof is to provide a halftone phase shift mask which can be used in an exposure wavelength range of 140 nm to 200 nm including a wavelength of an $F_2$ excimer laser of 157 nm, and a halftone phase shift mask blank for forming the halftone phase shift mask.

To achieve the aforementioned object, the present inventor et al have performed an intensive research/development. As a result, it has been found out that SiNx makes a matrix of a film dense by the virtue of an Si—N bond. This brings about the facts that $SiN_x$ has a high irradiation durability against an exposure light and a high chemical durability against detergent or the like. On the other hand, $SiO_x$ has a relatively high transmittance even on a short wavelength side. Under the circumstances, attention has been directed to $SiO_xN_y$ that has advantages of both materials mentioned above. Furthermore, it has been found that using $SiO_xN_y$ makes it possible to obtain a phase shifter film suitable for use in an exposure light having a short wavelength by controlling a composition of $SiO_xN_y$. The present invention has been made in consideration of the above-mentioned facts.

Now, the phase shifter film is basically different in a composition range from a conventional $SiO_xN_y$-based film, and is further different in film properties (e.g., physical properties such as k) from the conventional $SiO_xN_y$-based film. A combination of the composition range and film properties can realize a phase shifter film which has a transmittance of 3 to 40% and a refractive index (related to a film thickness for shifting the phase by a predetermined angle) of 1.7 or more in the vicinity of the wavelength of the $F_2$ excimer laser of 157 nm. Moreover, the phase shifter film is satisfactory in irradiation durability to exposure light and chemical durability.

Furthermore, when the phase shifter film is constituted in the form of a double-layer structure of an $SiO_xN_y$ film and an etching stopper film, a phase shifter film is satisfactory not only in the irradiation durability to exposure light and chemical durability but also in workability of a pattern.

The present invention has the following constitutions.

(Constitution 1) A halftone phase shift mask blank is for use in manufacturing a halftone phase shift mask which has a transmission portion for transmitting an exposure light, and a phase shifter portion for transmitting a part of the exposure light and for shifting a phase of the transmitted light by a predetermined amount on a transparent substrate and in which an optical property is designed so as to mutually cancel out the respective transmitted lights in the vicinity of a boundary portion of the transmission portion and the phase shifter portion and thereby a contrast of a boundary portion of an exposure pattern transferred onto the surface of a material to be exposed can satisfactorily be held and improved, and having a phase shifter film for forming the phase shifter portion on the transparent substrate, wherein the phase shift mask is used in an exposure light wavelength range of 140 nm to 200 nm, the phase shifter film is constituted of a film containing main constituting elements of silicon, oxygen, and nitrogen, and contains 35 to 45% of silicon, 1 to 60% of oxygen, and 5 to 60% of nitrogen in atomic percentage, and a total amount of these elements occupies at least 90% or more of a whole composition constituting the phase shifter film.

(Constitution 2) A halftone phase shift mask blank for use in manufacturing a halftone phase shift mask which has a transmission portion for transmitting an exposure light, and a phase shifter portion for transmitting a part of the exposure light and for shifting a phase of the transmitted light by a predetermined amount on a transparent substrate and in which an optical property is designed so as to mutually cancel out the respective transmitted lights in the vicinity of a boundary portion of the transmission portion and the phase shifter portion and thereby a contrast of a boundary portion of an exposure pattern transferred onto the surface of a material to be exposed can satisfactorily be held and improved, and having a phase shifter film for forming the phase shifter portion on the transparent substrate, wherein the phase shift mask is used in an exposure light wavelength range in the vicinity of 157 nm as a wavelength of an $F_2$ excimer laser, the phase shifter film is constituted of a film containing main constituting elements of silicon, oxygen, and nitrogen, and contains 35 to 40% of silicon, 25 to 60% of oxygen, and 5 to 35% of nitrogen in atomic percentage, and a total amount of these elements occupies at least 90% or more of a whole composition constituting the phase shifter film.

(Constitution 3) A halftone phase shift mask blank for use in manufacturing a halftone phase shift mask which has a transmission portion for transmitting an exposure light, and a phase shifter portion for transmitting a part of the exposure light and for shifting a phase of the transmitted light by a predetermined amount on a transparent substrate and in which an optical property is designed so as to mutually cancel out the respective transmitted lights in the vicinity of a boundary portion of the transmission portion and the phase shifter portion and thereby a contrast of a boundary portion of an exposure pattern transferred onto the surface of a material to be exposed can satisfactorily be held and improved, and having a phase shifter film for forming the phase shifter portion on the transparent substrate, wherein the phase shift mask is used in an exposure light wavelength range in the vicinity of 193 nm as a wavelength of an ArF excimer laser, the phase shifter film is constituted of a film containing main constituting elements of silicon, oxygen, and nitrogen, and contains 38 to 45% of silicon, 1 to 40% of oxygen, and 30 to 60% of nitrogen in atomic percentage, and a total amount of these elements occupies at least 90% or more of a whole composition constituting the phase shifter film.

(Constitution 4) A halftone phase shift mask blank for use in manufacturing a halftone phase shift mask which has a transmission portion for transmitting an exposure light, and a phase shifter portion for transmitting a part of the exposure light and for shifting a phase of the transmitted light by a predetermined amount on a transparent substrate and in which an optical property is designed so as to mutually cancel out the respective transmitted lights in the vicinity of a boundary portion of the transmission portion and the phase shifter portion and thereby a contrast of a boundary portion of an exposure pattern transferred onto the surface of a material to be exposed can satisfactorily be held and improved, and having a phase shifter film for forming the phase shifter portion on the transparent substrate, wherein the phase shift mask is used in an exposure light wavelength range of 140 nm to 200 nm, the phase shifter film is constituted of a film containing main constituting elements of silicon, oxygen, and nitrogen, a complex refractive index real part n of the phase shifter film with respect to the exposure light is 1.7 or more, and a complex reflective index imaginary part k is 0.450 or less.

Here, the aforementioned n, k have the following relation with an energy transmittance T of the mask, an energy reflectance R, a film thickness d of the phase shifter portion of the mask, and a refractive index $n_0$ of the mask substrate.

$$R = r\bar{r} \quad r = \frac{\rho_1 + \rho_2 e^{-2\delta}}{1 + \rho_1\rho_2 e^{-2\delta}} \quad \rho_1 = \frac{(n-ik)-1}{(n-ik)+1} \quad \rho_2 = \frac{(n-ik)-n_0}{(n-ik)+n_0}$$

$$\delta = \frac{2\pi nd}{\lambda} \quad T \simeq \bar{t}t * \frac{1}{n_0} \quad t = \frac{\tau_1\tau_2 e^{-i\delta}}{1 + \rho_1\rho_2 e^{-2i\delta}}$$

$$\tau_1 = \frac{2}{1+(n-ik)} \quad \tau_2 = \frac{2n_0}{n_0 + (n-ik)}$$

Herein, $\bar{r}$, $\bar{t}$ denote conjugated complex numbers of r, t, respectively.

(Constitution 5) A halftone phase shift mask blank for use in manufacturing a halftone phase shift mask which has a transmission portion for transmitting an exposure light, and a phase shifter portion for transmitting a part of the exposure light and for shifting a phase of the transmitted light by a predetermined amount on a transparent substrate and in which an optical property is designed so as to mutually cancel out the respective transmitted lights in the vicinity of a boundary portion of the transmission portion and the phase shifter portion and thereby a contrast of a boundary portion of an exposure pattern transferred onto the surface of a material to be exposed can satisfactorily be held and improved, and having a phase shifter film for forming the phase shifter portion on the transparent substrate, wherein the phase shifter film is constituted of a film containing main constituting elements of silicon, oxygen, and nitrogen, and an etching stopper film formed between the film and the transparent substrate.

(Constitution 6) The halftone phase shift mask blank according to Constitution 5 wherein the etching stopper film has a function for adjusting a transmittance.

(Constitution 7) The halftone phase shift mask blank according to Constitution 5 or 6 wherein the etching stopper film is a material which can be etched with an etching medium different from an etching medium of the film containing main constituting elements of silicon, oxygen, and nitrogen.

(Constitution 8) The halftone phase shift mask blank according to Constitution 5 or 6 wherein the etching stopper film is a material which can be etched with the same etching medium as an etching medium of the film containing the main constituting elements of silicon, oxygen, and nitrogen.

(Constitution 9) The halftone phase shift mask blank according to any one of Constitutions 5 to 8 wherein the phase shift mask is used in an exposure light wavelength range of 140 nm to 200 nm.

(Constitution 10) The halftone phase shift mask blank according to any one of Constitutions 5 to 9 wherein the film containing the main constituting elements of silicon, oxygen, and nitrogen contains 30 to 45% of silicon, 1 to 60% of oxygen, and 5 to 60% of nitrogen in the atomic percentage, and the total amount of these elements occupies at least 90% or more of the whole composition constituting the film.

(Constitution 11) A method in which the halftone phase shift mask blank according to any one of Constitutions 1 to 10 is manufactured, said method comprising steps of: using sputtering gases such as an inactive gas, an oxygen gas, and a nitrogen gas to sputter the film containing the main constituting elements of silicon, oxygen, and nitrogen in a reactive sputtering process; and setting a ratio of oxygen in said sputtering gas to a range of 0.2 to 30%.

(Constitution 12) A halftone phase shift mask which has a mask pattern constituted of a light transmission portion and a phase shifter portion and obtained by subjecting the phase shifter film in the halftone phase shift mask blank according to any one of Constitutions 1 to 11 to a patterning treatment to selectively remove the phase shifter film and obtain a predetermined pattern.

(Constitution 13) A pattern transfer method in which the halftone phase shift mask according to Constitution 12 is used to transfer the pattern.

DETAILED DESCRIPTION OF THE PREFERRED EMBODIMENTS

Figure 1:
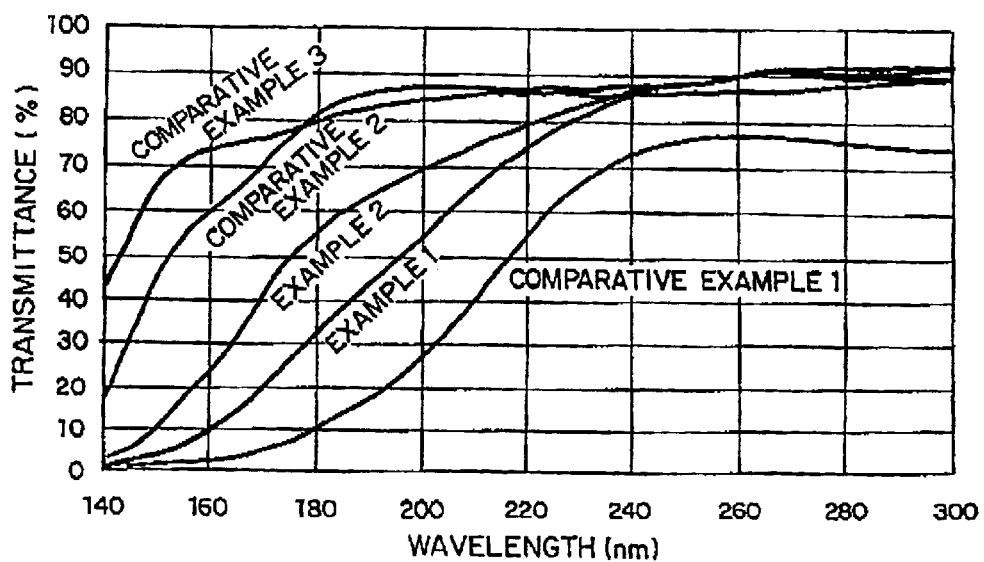
FIG. 1 is a diagram showing a transmission spectrum of samples or specimens prepared in examples according to the present invention and comparative examples.

The present invention will be described hereinafter in detail with reference to the drawings.

In a halftone phase shift mask and blank according to the present invention, selection is made about $SiO_xN_y$ constituted of silicon, oxygen, and nitrogen as a film material constituting a phase shifter portion or a phase shifter film. Such a material is practically selected among a great number of materials known as film materials for a KrF excimer laser and ArF excimer laser.

Moreover, a reactive sputtering method is selected as a manufacturing method so that a desired transmittance and a desired phase shift amount are given in an exposure light wavelength range of 140 nm to 200 nm, particularly in the vicinity of a wavelength of an $F_2$ excimer laser of 157 nm. Furthermore, a gas flow rate is limited and controlled in a predetermined narrow range.

Description will be at first made about a phase shift mask and blank having a phase shifter film (phase shifter portion) of a single-layer structure of an $SiO_xN_y$ film according to a first aspect of the present invention.

In the present invention, manufacturing conditions are adjusted and controlled. Specifically, the phase shifter portion or the phase shifter film has a film thickness such that a phase shift amount of 180° is given to an exposure light of a ultraviolet region in a vacuum. The exposure light may have a wavelength range of 140 nm to 200 nm that includes 157 nm as the wavelength of $F_2$ excimer laser. In this case, a real part n of a complex refractive index is adjusted and controlled within a range of $n \geq 1.7$, and an imaginary part k of the complex refractive index is adjusted and controlled within a range of $k \leq 0.450$. Thereby, an optical property of the halftone phase shift mask for the ultraviolet exposure light in vacuum is satisfied. Additionally, for the $F_2$ excimer laser, a range of $k \geq 0.40$ is preferable, and a range of $0.07 \leq k \leq 0.35$ is more preferable. For the ArF excimer laser, a range of $0.10 \leq k \leq 0.45$ is preferable. Moreover, for the $F_2$ excimer laser, a range of $n \geq 2.0$ is preferable, and a range of $n \geq 2.2$ is more preferable. For the ArF excimer laser, a range of $n \geq 2.0$ is preferable, and a range of $n \geq 2.5$ is more preferable.

In order to accomplish the optical property, as a composition range of each constituting element, a range of 35 to 45 atomic % is set for silicon, 1 to 60 atomic % is set for oxygen, and 5 to 60 atomic % is set for nitrogen. That is, if the range of silicon exceeds 45 atomic %, or the range of nitrogen exceeds 60 atomic %, a light transmittance of the film becomes insufficient. Conversely, if the range of nitrogen is less than 5 atomic %, or the range of oxygen exceeds 60 atomic %, the transmittance of the film is too high, and a function of the halftone phase shifter film is lost. Moreover, if the range of silicon is less than 35 atomic %, or the range of nitrogen exceeds 60 atomic %, the structure of the film chemically becomes very unstable.

Additionally, similarly from the aforementioned viewpoint, the composition range of each constituting element for the $F_2$ excimer laser is preferably set to 35 to 40 atomic % for silicon, to 25 to 60 atomic % for oxygen, and to 5 to 35 atomic % for nitrogen. Similarly, the composition range of each constituting element for the ArF excimer laser is preferably set to 38 to 45 atomic % for silicon, to 1 to 40 atomic % for oxygen, and to 30 to 60 atomic % for nitrogen.

In the halftone phase shift mask and blank according to the present invention, it is possible to control the transmittance and phase shift amount at the same time, by mainly changing a composition ratio of oxygen and nitrogen. Specifically, the transmittance can be increased with an increase of the amount of oxygen while the refractive index can be increased with an increase of the amount of nitrogen.

Moreover, since the above-mentioned structure of the film has a matrix that includes Si—O bonds and Si—N bonds both of which have strong chemical durability, it is possible to avoid degradation of the film properties due to detergent used in a cleaning process. Furthermore, since the Si—N bond enhances a density of the film, the film can not suffer from any damages that may result from irradiation of high energy light of a short wavelength.

Furthermore, when the material constituting the phase shifter film contains nitrogen, workability of patterning by dry etching can be enhanced. That is, when the material contains nitrogen, the refractive index of the phase shifter portion increases, and a film thickness needed for obtaining the phase shift amount of 180° decreases. Therefore, it is possible to accomplish a pattern configuration that has a smaller aspect ratio (pattern linear width/film thickness) and a stable shape. Moreover, since the material contains nitrogen, a refractive index difference from the substrate is enlarged, a change of reflectance at an end point of etching becomes large, and it is easy to detect the end point As described above, when the amount of oxygen is increased in the film in the phase shift mask and mask blank having the phase shifter film constituted of a single layer only of the $SiO_xN_y$ film according to the present invention, a problem might be caused to occur in a processing precision in a depth direction of the phase shifter film. Reasons for this will be described hereinafter.

In order to obtain a sufficient processing precision in etching the phase shift mask, anisotropic etching should be carried out at least in the depth direction. To this end, dry etching is used, Among others, reactive ion etching (RIE) by fluoride gases such as $CHF_3$, $CF_4$, $SF_8$, $C_2F_6$ and mixture gas is widely used in the art.

On the other hand, most of the existing mask substrates are usually composed of synthetic quartz substrates. However, it is to be noted that an etching rate of synthetic quartz to the fluoride gas is relatively large. Therefore, when the etching is continued even after completion of the etching of the phase shifter film, the substrate is also etched, and the phase difference is larger than 180°. Therefore, enhancement of resolution by a phase shift cannot be achieved.

To prevent this, the end point has to be precisely detected in an etching process of the phase shift mask, and several judgment methods have been proposed. A most general and effective method is a method of irradiating a portion to be etched with a light having a specific wavelength (e.g., 680 nm), detecting a change of a reflected light strength with time, and identifying the end point.

Additionally, when the phase shifter film according to the present invention has only the single-layer constitution of the $SiO_xN_y$ film, and the amount of oxygen is large, the change of reflection strength cannot sufficiently be obtained even with progress of the etching of the portion to be etched because of similarity of the composition and refractive index to the synthetic quartz substrate. This might deteriorate the working or processing precision of the depth direction in the phase shifter film.

Therefore, when synthetic quartz is usually used as the substrate and the oxygen amount of the $SiO_xN_y$ film becomes large in the phase shifter film like in the phase shift mask and mask blank of the present invention, it is preferable to dispose an etching stopper film between the $SiO_xN_y$ film and the synthetic quartz substrate. In this case, the phase shifter film has a two-layer structure of the $SiO_xN_y$ film and etching stopper film, and a predetermined phase angle and transmittance are adjusted in the two-layer structure.

Here, the etching stopper film is formed of a material which has a function for stopping the progress of the etching of the $SiO_xN_y$ film, or a function for facilitating detection of the end point of the etching of the phase shifter film, or which has both the functions.

The former film having the function for stopping the progress of the etching of the $SiO_xN_y$ film is formed of a material having a low selection ratio to the etching of a phase shifter layer, that is, a material that exhibits a low etching rate to an etchant for use in etching the $SiO_xN_y$ film, in comparison with the etching rate of the $SiO_xN_y$ film itself. Specifically, the film is preferably formed of the material that has the etching selection ratio to the phase shifter film of 0.7 or less, preferably 0.5 or less.

Moreover, the latter etching stopper film having the function for facilitating the end point detection of the etching of the phase shifter film is a film formed of a material in which a difference of reflectance between the transparent substrate (e.g., the synthetic quartz substrate) and an etching end point detection light (e.g., 680 nm) of an etching stopper is larger than the difference between the transparent substrate and the $SiO_xN_y$ film. The preferable film is formed of a material that has a refractive index (the real part of the refractive index) higher than that of the $SiO_xN_y$ film or the transparent substrate. Specifically, the refractive index difference in the wavelength between the $SiO_xN_y$ film and the etching end point detection light may be 0.5 or more, preferably 1 or more.

As to the etching stopper film, the etching selection ratio of the etching stopper film to the substrate is 1.5 or more, preferably 2.0 or more. Specifically, when the etching stopper film cannot be removed, the transmittance in a light transmission portion decreases, and a contrast is deteriorated on pattern transfer. Even when the layer can be removed but the etching rate is not larger than that of the substrate, the substrate might be etched in the vicinity of the end point of the etching, and the processing or working precision is deteriorated.

Taking the aforementioned respects into account, suitable materials of the etching stopper film may include one or two or more materials selected from magnesium, aluminum, titanium, vanadium, chromium, yttrium, zirconium, niobium, molybdenum, tin, lanthanum, tantalum, tungsten, silicon, and hafnium, a compound (oxide, nitride, nitric oxide) of these elements, and the like.

The etching stopper film preferably has a thickness falling within a range of 10 to 200 angstroms. That is, when the thickness is smaller than 10 angstroms, the etching cannot completely be stopped, and a significant reflectance change cannot be detected, and therefore the pattern processing precision may be deteriorated. On the other hand, the pattern by an isotropic progress of etching may be advanced or expanded up to about twice the film thickness at maximum, depending upon the etching process selected. Therefore, when a pattern line width of 0.1 $\mu$m=1000 angstroms or less is processed, and the film thickness exceeds 200 angstroms, a dimension or size error reaches to 40% or more, and properties of the mask are seriously adversely influenced.

Furthermore, the etching stopper layer preferably has a function for adjusting the transmittance. When the transmittance to the exposure light wavelength (wavelength in a range of 140 to 200 nm, or in the vicinity of 157 nm or 193 nm) of the etching stopper layer is set to a range of 3 to 40%, the transmittance in the phase shifter portion is held. Moreover, it is possible to reduce the transmittance of a test wavelength longer than the exposure light wavelength by the etching stopper layer formed in a lower part of the phase shifter portion (laminate of different materials). That is, to test the mask in a manufacturing process, a light having a wavelength longer than the exposure light wavelength is used to measure the transmission light strength in the existing method. The transmittance of the light semi-transmission (translucent) portion (phase shifter portion) is preferably 40% or less in the existing range of the test wavelength of 200 to 300 nm. On the other hand, when the transmittance is 40% or more, a contrast is not sufficient enough between the light transmission portion and the light translucent portion and a test precision becomes worse. When the etching stopper film is formed of a high opaque material, examples of the material include one or two or more materials selected from aluminum, titanium, vanadium, chromium, zirconium, niobium, molybdenum, lanthanum, tantalum, tungsten, silicon, and hafnium, and nitride of these elements. Moreover, such a etching stopper layer is preferably sufficiently thinner in thickness than the phase shifter portion, and is appropriately 200 angstroms or less thick. That is, when the thickness exceeds 200 angstroms, the transmittance in the exposure light wavelength is lower than 3% with a high possibility. In this case, the phase angle and transmittance should be adjusted between two layers of the $SiO_xN_y$ film and etching stopper film. Concretely, the transmittance to the exposure light wavelength (the wavelength in a range of 140 to 200 nm, or in the vicinity of 157 nm or 193 nm) of the etching stopper is set to 3 to 40%, and preferably adjusted so that the transmittance of the laminate with the $SiO_xN_y$ film is in a range of 3 to 40%. When the phase shifter layer is disposed, the etching stopper layer exposed on the surface of the portion corresponding to the light transmission portion needs to be removable. When the light transmission portion is coated with the etching stopper layer, the transmittance of the light transmission portion decreases. For a method of removing the etching stopper film, when the etching stopper film is formed of the material having the function for stopping the progress of etching of the $SiO_xN_y$ film, it is necessary to use a method different from an etching method of the $SiO_xN_y$ film. Moreover, when the etching stopper film is formed of the material having the function for facilitating the end point detection of the etching of the phase shifter film, the etching method of the $SiO_xN_y$ film may be the same as or different from that of the etching stopper film. The phase shifter film formed of the $SiO_xN_y$ film may be etched by a dry etching such as a reactive ion etching (RIE) using, for example, fluorine-based gases such as $CHF_3$, $CF_4$, $SF_6$, $C_2F_6$ and the mixture gas. On the other hand, when the etching stopper film is etched/removed in a method different from that of the phase shifter film, a dry etching using the fluorine-based gas different from that used in removing the phase shifter film, a dry etching using a chlorine-based gas such as $Cl_2$, $Cl_2+O_2$, or a wet etching using acid, alkali, or the like can be used.

Examples of the preferable material of the etching stopper film removable by the same fluoride-based dry etching as the etching of the phase shifter film of the $SiO_xN_y$ film include silicon, $MoSi_x$, $TaSi_x$, and the like. When the etchable etching stopper film is disposed in continuity with the $SiO_xN_y$ film, a large merit in the process can be obtained. Moreover, examples of the preferable material of the etching stopper film etchable by a method different from the method of the etching of the phase shifter film of the $SiO_xN_y$ film include Ta etchable by the dry etching of $Cl_2$, or a thin film containing Ta such as $TaN_x$, $TaZr_x$, $TaCr_x$, $TaHf_x$, and Cr etchable by the dry etching of $Cl_2+O_2$.

Additionally, when the etching stopper film is formed of the material having the function for stopping the progress of the etching of the $SiO_xN_y$ film, and having a high transmittance, the etching stopper film may be disposed between the transparent substrate and the light semi-transmission (translucent) film of the halftone phase shift mask having the single-layer structure. In this case, the etching stopper may not be removed at a portion exposed on the light transmission portion.

When oxygen of the $SiO_xN_y$ film exceeds 40 atomic %, or the refractive index difference from the transparent substrate is 0.5 or less, preferably 0.3 or less, disposition of the etching stopper layer is particularly efficient.

Also for the $SiO_xN_y$ film of the phase shift mask blank having the light translucent film which has the two-layer structure of the $SiO_xN_y$ film and etching stopper film according to the present invention, it is preferable to dispose the $SiO_xN_y$ film that has the composition or the refractive index selected in the manner similar to that of the aforementioned single-layer structure.

In consideration of obtained film properties (e.g., physical properties such as k, n, controllability of the film properties, obtained composition, controllability of the composition, and mass productivity, a reactive sputtering method is selected so as to manufacture the phase shifter film according to the present invention. In the reactive sputtering method, it is possible to determine components of the film formed on the substrate in accordance with a combination of a target and sputtering gas. For example, when the phase shifter film is prepared, silicon or the target containing silicon is used as the sputtering target. For the sputtering gas, it is possible to use the sputtering gas obtained by appropriately mixing various nitrogen and oxygen sources such as nitrogen, oxygen, nitrogen monoxide, nitrogen dioxide, and dinitrogen monoxide, and inactive gases such as argon and xenon. Moreover, a power supply system (RF, DC, and the like) of the sputtering apparatus, sputtering output, gas pressure, presence/absence of substrate heating, and the like may appropriately be selected in accordance with the type of the target or gas for use, and targeted film properties.

EXAMPLES

Examples of the present invention will be described hereinafter together with Comparative Examples and the like.

Examples 1–2, Comparative Examples 1–2, Reference Example 1

(Single-Layer Type: for $F_2$)

The halftone phase shifter film was formed on the quart substrate by RF sputtering discharge. As the target, Si or $SiO_2$ was used. Argon, oxygen, and nitrogen gases were used as the sputtering gas, and flow rates of nitrogen and oxygen were varied to change a preparation condition. The gas flow rate conditions of the respective examples, comparative examples, and reference examples are shown in Table 1. Additionally, the film thickness was adjusted so that the phase shift amount in the wavelength (157 nm) of the $F_2$ excimer laser was 180°.

Samples of Table 1 were subjected to composition analysis of the phase shifter film by an X-ray photo-electron spectral analysis (XPS). Furthermore, a ultraviolet to visible spectral photometer was used to measure the transmittance and reflectance of each sample, and wavelength dispersion of the real part n of the complex refractive index, and the imaginary part of the complex refractive index (extinction coefficient) k was calculated from obtained values by a least square fitting. Results of the composition analysis, and values of n, k, and transmittance in the exposure light wavelength of the $F_2$ excimer laser of 157 nm are shown in Table 2. Moreover, transmission spectrum is shown in FIG. 1.

TABLE 1

(For $F_2$)

| | Target | Substrate | Gas ratio (%) | | |
| --- | --- | --- | --- | --- | --- |
| | | | Argon | Nitrogen | Oxide |
| Example 1 | Si | $CaF_2$ | 40.0 | 59.45 | 0.55 |
| Example 2 | Si | $CaF_2$ | 40.0 | 59.00 | 1.00 |
| Comparative Example 1 | Si | $CaF_2$ | 40.0 | 60.00 | 0.00 |
| Comparative Example 2 | Si | $CaF_2$ | 40.0 | 58.00 | 2.00 |
| Reference Example 1 | $SiO_2$ | $CaF_2$ | 100.0 | 0.00 | 0.00 |

TABLE 2

(For $F_2$)

| | Film composition (atomic %) | | | Film thickness | Refractive index real part n | Refractive index imaginary part k | Transmittance(%) |
| --- | --- | --- | --- | --- | --- | --- | --- |
| | Silicon | Oxygen | Nitrogen | (Å) | (157 nm) | (157 nm) | (157 nm) |
| Example 1 | 38.9 | 31.5 | 29.6 | 534.2 | 2.4695 | 0.4464 | 8.1 |
| Example 2 | 36.3 | 48.7 | 15.0 | 657.7 | 2.1935 | 0.2140 | 22.1 |
| Comparative example 1 | 44.2 | 1.2 | 54.6 | 389.3 | 3.0165 | 0.9517 | 2.1 |
| Comparative example 2 | 33.4 | 61.9 | 4.7 | 877.3 | 1.6948 | 0.0458 | 57.8 |
| Reference example 1 | (Not measured) | | | 1100.5 | 1.7133 | 0.0219 | 73.4 |

It can be confirmed from Table 2 and FIG. 1 that a sample having a transmittance of 2 to 73% in the wavelength of 157 nm is obtained by changing a ratio (%) of oxygen in a total gas during film formation [=(flow rate of oxygen/total of flow rates of respective gases)×100] in a range of 0% to 2% (0% exclusive) and that the transmittance range of 3 to 40% sufficient for the halftone phase shift mask is obtained in Examples 1, 2. In Comparative Example 1, since the oxygen amount in the film is small, the transmittance is less than 3% and the extinction coefficient is large. Moreover, in Comparative Example 2, and Reference Example 1, since the oxygen amount is too large, the transmittance largely exceeds 40%. Therefore, it can be said to be difficult to use the masks of these examples as the halftone phase shift mask in the wavelength of 157 nm. Additionally, oxygen was detected as an Impurity also in Comparative Example 1.

Each sample of Table 2 was steeped or soaked in each of over-hydrated sulfuric acid ($H_2SO_4+H_2O_2$) and over-hydrated ammonia ($NH_3aq+H_2O_2$) for one hour, a change of transmittance by the spectral photometer was not observed. Therefore, it has been confirmed that the prepared samples have a sufficient high chemical durability.

Figure 4A:
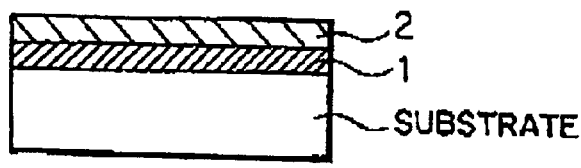
FIGS. 4A through 4D are schematic explanatory diagrams for describing a manufacturing process of a phase shift film.
Figure 4B:
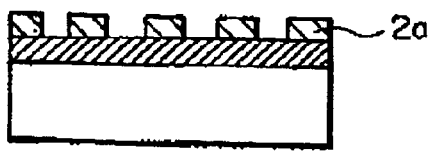

After the single-layer film was formed, in Examples 1, 2, a resist film 2 was formed on the obtained single-layer film 1 (FIG. 4A), and a resist pattern 2a was formed by pattern exposure and image development (FIG. 4B).

Figure 4C:
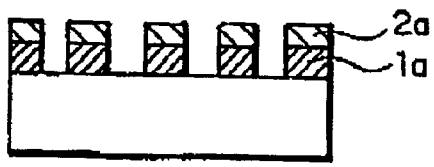
Figure 4D:
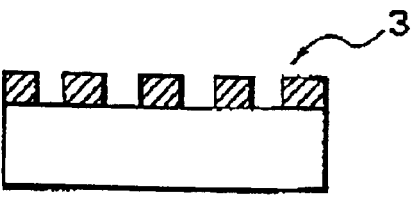

Thereafter, a single-layer film under the resist pattern 2a was patterned, and a pattern 1a of a single-layer film was obtained (FIG. 4C). In these examples, when a $CF_4$ gas was used to etch the film, a satisfactory pattern shape was obtained. A dry etching selection ratio between the substrate and film was 5. Finally, a resist removal liquid was used to remove a resist, and a halftone phase shift mask 3 for the $F_2$ excimer laser exposure light was obtained through a cleaning/rinsing process (FIG. 4D).

Example 3, Comparative Examples 3–4, Reference Example 2

(Single-Layer Type: for ArF)

The quarts substrate was used as the substrate, and the halftone phase shifter film for ArF was formed in a manner similar to that of forming the halftone phase shifter film for $F_2$. The gas flow rate conditions of the respective example, comparative examples, and reference example are shown in Table 3. Additionally, the film thickness was adjusted so that the phase shift amount in the wavelength of ArF excimer laser (193 nm) was 180°.

The samples of Table 3 were subjected to the composition analysis of the phase shifter film by the X-ray photo-electron spectral analysis (XPS). Furthermore, the ultraviolet to visible spectral photometer was used to measure the transmittance and reflectance of each sample, and the wavelength dispersion of the real part n and the imaginary part (extinction coefficient) k of the complex refractive index was calculated from the obtained values. The results of the composition analysis, and the values of n, k, and transmittance in the wavelength of 193 nm as the exposure light wavelength of the ArF excimer laser are shown in Table 4.

TABLE 3

(For ArF)

|  | Target | Substrate | Gas ratio (%) | | |
|---|---|---|---|---|---|
|  |  |  | Argon | Nitrogen | Oxide |
| Example 3 | Si | Synthetic quartz | 40.0 | 59.45 | 0.55 |
| Comparative example 3 | Si | Synthetic quartz | 40.0 | 59.00 | 1.00 |
| Comparative example 4 | Si | Synthetic quartz | 98.0 | 0.00 | 2.00 |
| Reference example 2 | $SiO_2$ | Synthetic quartz | 100.0 | 0.00 | 0.00 |

TABLE 4

(For ArF)

|  | Film composition (atomic %) | | | Film thickness | Refractive index real part n | Refractive index imaginary part k | Transmittance(%) |
|---|---|---|---|---|---|---|---|
|  | Silicon | Oxygen | Nitrogen | (Å) | (193 nm) | (193 nm) | (193 nm) |
| Example 3 | 38.9 | 31.5 | 29.6 | 834.6 | 2.1607 | 0.2108 | 35.40 |
| Comparative example 3 | 36.3 | 48.7 | 15.0 | 1050.4 | 1.9219 | 0.0356 | 57.87 |
| Comparative example 4 | 60.7 | 39.3 | 0.0 | 843.8 | 2.2236 | 1.3730 | 0.08 |
| Reference example 2 | 33.4 | 61.9 | 4.7 | 1426.9 | 1.6793 | 0.0063 | 77.09 |

As shown in Table 4, the transmittance range of 3 to 40% in Example 3 is sufficient enough for the halftone phase shift mask. In Comparative Example 3, since the ratio of oxygen is large, the transmittance indicates a large value. When $N_2$ is not caused to flow, as shown in Comparative Example 4, the ratio of silicon becomes large and is reached to about 60%. Therefore, it has also been confirmed that the sufficient transmittance cannot be obtained and k also indicates a very large value. Additionally, since a fluctuation of the depth direction in composition is not confirmed in any film, the prepared film is said to be homogenized.

Each sample of Table 4 was steeped or soaked in each of over-hydrated sulfuric acid ($H_2SO_4+H_2O_2$) and over-hydrated ammonla ($NH_3aq+H_2O_2$) for one hour, a change of transmittance by the spectral photometer was not observed. Therefore, it has been confirmed that the prepared samples have the sufficient high chemical durability.

After the single-layer film was formed, in Example 3, the resist film was formed on the obtained single-layer film, and the resist pattern was formed by the pattern exposure and image development. Thereafter, the single-layer film under the resist pattern was patterned by the dry etching method. In the example, when a $C_2F_6$ gas was used to etch the film, the satisfactory pattern shape was obtained. The dry etching selection ratio between the substrate and film was 1.5. Finally, the resist removal liquid was used to remove the resist, and the halftone phase shift mask for the ArF excimer laser exposure light was obtained through the cleaning/rinsing process.

Examples 4 to 11

Examples 4 to 11 indicate specific samples of the halftone phase shift mask for the $F_2$ excimer laser exposure light. In each of the examples, the synthetic quartz substrate was used as the substrate, and the etching stopper layer was disposed between the substrate and the $SiO_xN_y$ layer.

(Film Deposition)

First, a layer A as the etching stopper layer and a layer B of $SiO_xN_y$ are stacked or laminated in order on the synthetic quartz substrate. In the examples, the laminate was prepared by the sputtering method. Basic compositions of the layers A, B of the two-layer film, conditions such as the types of the target and sputtering gas, and film thickness of each layer for each example are shown in Table 5. Additionally, the equation (1) is utilized to adjust the film thickness of each of the layers A, B so that a total sum of the phase shift amounts of the respective layers becomes equal to 180° in the wavelength of 157 nm.

(Optical Properties)

Figure 2:
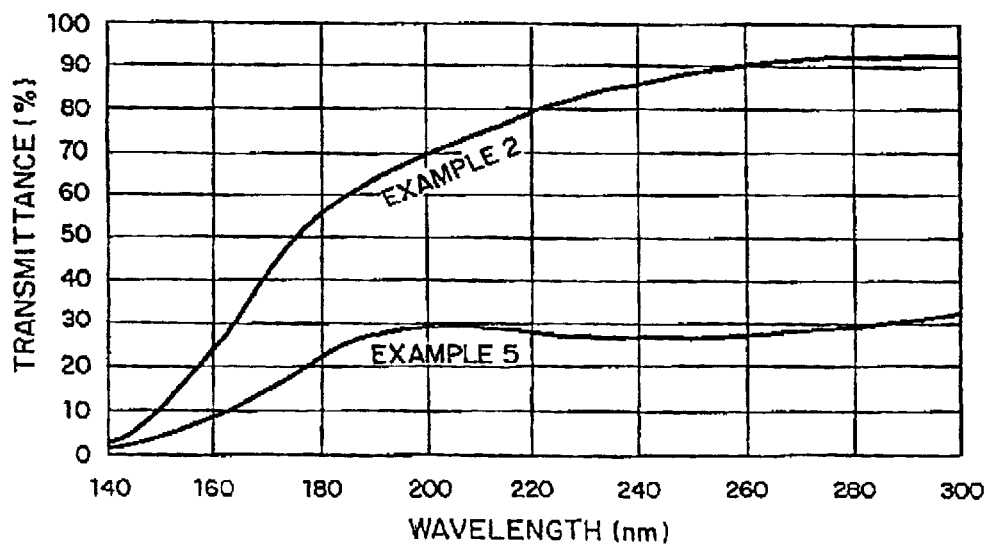
FIG. 2 is a diagram showing the transmission spectrum in a light semi-transmission portion (phase shifter portion) of the sample prepared in Example 5.

When the vacuum ultraviolet spectral photometer was used to measure the transmittance of the prepared two-layer film (laminate), the transmittance in the wavelength of the $F_2$ excimer laser of 157 nm was shown in Table 6. Even when the etching stopper layer was disposed, the transmittance in a range of 3 to 40% sufficient/necessary for the halftone phase shift mask was obtained. Moreover, a transmission spectrum of Example 5 is shown in FIG. 2. The test wavelength of the halftone phase shift mask for the $F_2$ excimer laser exposure light is set to around 250 nm. However, since the transmittance in the range is 40% or less, a sufficient test precision can be expected to be obtained. Additionally, similarly in Examples 4, 6 to 10, the transmittance in the wavelength around 250 nm was 40% or less.

TABLE 5

|  | Target | Substrate | Gas ratio (%) | | | Film thickness |
|---|---|---|---|---|---|---|
|  |  |  | Argon | Nitrogen | Oxygen | (nm) |
| Example 4 | Layer A: $Al_2O_3$ | Synthetic quartz | 100.0 | 0.00 | 0.00 | 15 |
|  | Layer B: Si |  | 40.0 | 59.00 | 1.00 | 75 |

TABLE 5-continued

|  | Target | Substrate | Gas ratio (%) | | | Film thickness (nm) |
|---|---|---|---|---|---|---|
|  |  |  | Argon | Nitrogen | Oxygen |  |
| Example 5 | Layer A: Ta | Synthetic | 40.0 | 60.00 | 0.00 | 10 |
|  | Layer B: Si | quartz | 40.0 | 59.00 | 1.00 | 72 |
| Example 6 | Layer A: Ta—Zr | Synthetic | 100.0 | 0.00 | 0.00 | 8 |
|  | Layer B: Si | quartz | 40.0 | 59.00 | 1.00 | 78 |
| Example 7 | Layer A: Ta—Hf | Synthetic | 100.0 | 0.00 | 0.00 | 8 |
|  | Layer B: Si | quartz | 40.0 | 59.00 | 1.00 | 78 |
| Example 8 | Layer A: Zr | Synthetic | 100.0 | 0.00 | 0.00 | 5 |
|  | Layer B: Si | quartz | 40.0 | 59.00 | 1.00 | 80 |
| Example 9 | Layer A: Hf | Synthetic | 100.0 | 0.00 | 0.00 | 5 |
|  | Layer B: Si | quartz | 40.0 | 59.00 | 1.00 | 80 |
| Example 10 | Layer A: Si | Synthetic | 100.0 | 0.00 | 0.00 | 4 |
|  | Layer B: Si | quartz | 40.0 | 59.00 | 1.00 | 80 |
| Example 11 | Layer A: MoSi$_2$ | Synthetic | 100.0 | 0.00 | 0.00 | 8 |
|  | Layer B: Si | quartz | 10.0 | 60.00 | 30.00 | 86 |

TABLE 6

| | Transmittance (%) (157 nm) |
|---|---|
| Example 4 | 13.1 |
| Example 5 | 7.6 |
| Example 6 | 6.6 |
| Example 7 | 5.8 |
| Example 8 | 15.7 |
| Example 9 | 14.2 |
| Example 10 | 9.8 |
| Example 11 | 10.1 |

(Processing)

In Examples 4 to 9, the resist was applied to the prepared two-layer film, and the resist pattern was formed through the exposure/development process. Thereafter, the upper layer B (SiO$_x$N$_y$ film) of the two-layer film was etched by the dry etching method by using the resist pattern as a mask. In the examples, the CF$_4$ gas was used, and the etching time was set to a time that is longer by 30% than a time of substantially etching the film thickness of the SiO$_x$N$_y$ layer. As a result, the SiO$_x$N$_y$ film was patterned along the resist pattern, and the progress of etching was stopped on the etching stopper film of the lower layer. Etching rates of the synthetic quartz substrate and layers A and B (SiO$_x$N$_y$) separately obtained by the experiment in the examples are shown in Table 7. As compared with the layer B, the etching rate of the layer A is reduced to 1/5 or less. It can be confirmed that the layer A in Examples 4, 5 serves as the etching stopper film "having the function for stopping the progress of etching of the SiO$_x$N$_y$ film".

Subsequently, the layer A exposed on the surface was removed by etching. When over-hydrated sulfuric acid in Example 4, and Cl$_2$ gas in Examples 5 to 9 were used in Example 4, the satisfactory pattern shape was obtained. The etching rates of the synthetic quartz substrate and layer A separately obtained by the experiment are shown in Table 8. As compared with the synthetic quartz substrate, the etching rate of the layer A is five times or more. It can also be confirmed that the layer A in Examples 4, 5 is a "removable" layer.

Figure 3:
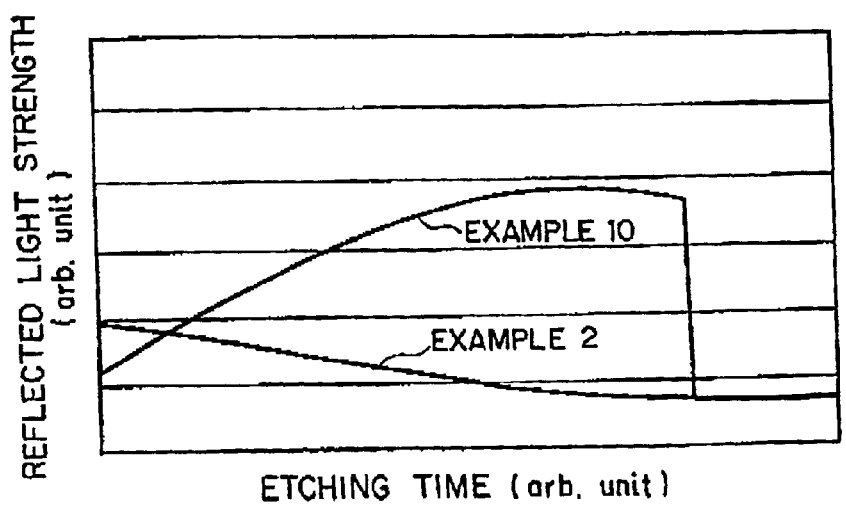
FIG. 3 is a diagram showing a relationship between an etching time and a reflected light strength of the sample prepared in the example.

In Examples 10, 11, the resist was applied onto the prepared two-layer film, and the resist pattern was formed through the exposure/development process. Thereafter, the upper layer B (SiO$_x$N$_y$) and the lower layer A were selectively etched by the CF$_4$ gas by using the resist pattern as the mask. In this case, a relationship between the etching time and the reflected light strength of the etched portion with respect to a light with a wavelength of 678 nm is plotted, and shown as Example 10 in FIG. 3. It is confirmed that the reflected light strength rapidly decreases after lapse of a certain time. When the etching was stopped at this time point, for both the layers A, B, the satisfactory pattern shape was obtained on the basis of the resist pattern. That is, it can be confirmed that the layer A in Example 10 serves as the etching stopper film that has the function for facilitating the end point detection of the etching of the SiO$_x$N$_y$ film and that is removable. Additionally, the respective refractive indexes (the real parts of the complex refractive indexes) of the synthetic quartz substrate and the layers A and B are equal to 1.47, 4.70, and 1.67, respectively, for the wavelength of 678 mm. When the refractive index of the layer B is greater than the indexes of the synthetic quartz substrate and layer A by 1 or more, the reflected light strength rapidly changes before and after the etching of the layer B as shown in FIG. 3, and therefore the end point of etching can be readily detected. The similar change of the reflected light strength was obtained also in Example 11. Additionally, also for Example 2, the relation between the etching time and the reflected light strength is plotted, and also shown in FIG. 3. The end point can also be detected in Example 2, but the end point is clearer in Example 10.

TABLE 7

| | CF$_4$ etching rate (Å/min) | Selection ratio (A/B) | Selection ratio (To substrate) |
|---|---|---|---|
| Quarts substrate | 118.83 | | |
| Layer B (SiO$_x$N$_y$) | 148.7 | | 1.25 |
| Layer A (AlO$_x$) | N.D.*1 | <<0.1 | <<0.1 |
| Layer A (TaN$_x$) | 15 | 0.101 | 0.13 |
| Layer A (Ta—Zr) | 10 | 0.067 | 0.08 |
| Layer A (Ta—hf) | 20 | 0.134 | 0.17 |
| Layer A (Zr) | N.D. | <<0.1 | <<0.1 |
| Layer A (Hf) | 8 | 0.054 | 0.07 |

*1 N.D. [not detected] indicates that the value is too small to be measured.

TABLE 8

|  | $Cl_2$ etching rate (Å/min) | Selection ratio (To substrate) | Over-hydrated sulfuric acid etching rate (Å/min) | Selection ratio (To substrate) |
|---|---|---|---|---|
| Quarts substrate | 269.8 |  | 0 |  |
| Layer B ($SiO_xN_y$) | 415.9 | 1.54 | 0 |  |
| Layer A ($AlO_x$) | 101 | 0.37 | Momentarily solved | >>10 |
| Layer A ($TaN_x$) | 2039.6 | 7.56 |  |  |
| Layer A (Ta—Zr) | 4020 | 14.90 |  |  |
| Layer A (Ta—Hf) | 3000 | 11.12 |  |  |
| Layer A (Zr) | 3300 | 12.23 |  |  |
| Layer A (Hf) | 2800 | 10.38 |  |  |

As described above, according to the present invention, there can be provided a phase shift mask or a phase shift mask blank in which the desired transmittance and phase shift amount are given for an exposure light wavelength range of 140 nm to 200 nm, particularly in the vicinity of 157 nm as the wavelength of the $F_2$ excimer laser, and which has a phase shifter portion or a phase shifter film satisfactory in irradiation durability and chemical durability, workability, moldability, and shape stability.

Furthermore, when the phase shifter film is constituted in the two-layer structure of the $SiO_xN_y$ film and etching stopper film, it is possible to obtain the phase shifter film that is satisfactory in not only the irradiation durability and the chemical durability but also the processability or workability of the pattern.

What is claimed is:

1. A halftone phase shift mask blank for use in manufacturing a halftone phase shift mask which has a transmission portion for transmitting an exposure light, and a phase shifter portion for transmitting a part of the exposure light and for shifting a phase of the transmitted light by a predetermined amount on a transparent substrate, the halftone phase shift mask having an optical property that is designed so as to mutually cancel out the respective transmitted lights in the vicinity of a boundary portion of said transmission portion and the phase shifter portion to thereby keep a contrast of a boundary portion of an exposure pattern transferred onto the surface of a material to be exposed, said blank having a phase shifter film for forming said phase shifter portion on the transparent substrate, wherein said phase shift mask is used in an exposure light wavelength range of 140 nm to 200 nm, said phase shifter film is constituted of a film containing main elements of silicon, oxygen, and nitrogen, and contains 35 to 45% of silicon, 1 to 60% of oxygen, and 5 to 60% of nitrogen in atomic percentage, and a total amount of these elements is not smaller than 90% in a whole composition constituting said phase shifter film.

2. A halftone phase shift mask blank for use in manufacturing a halftone phase shift mask which has a transmission portion for transmitting an exposure light, and a phase shifter portion for transmitting a part of the exposure light and for shifting a phase of the transmitted light by a predetermined amount on a transparent substrate, the halftone phase shift mask having an optical property that is designed so as to mutually cancel out the respective transmitted lights in the vicinity of a boundary portion of said transmission portion and the phase shifter portion to thereby keep a contrast of a boundary portion of an exposure pattern transferred onto the surface of a material to be exposed, said blank having a phase shifter film for forming said phase shifter portion on the transparent substrate, wherein said phase shift mask is used in an exposure light wavelength range in the vicinity of 157 nm as a wavelength of an F2 excimer laser, said phase shifter film is constituted of a film containing main elements of silicon, oxygen, and nitrogen, and contains 35 to 40% of silicon, 25 to 60% of oxygen, and 5 to 35% of nitrogen in atomic percentage, and a total amount of these elements is not smaller than 90% in a whole composition constituting said phase shifter film.

3. A halftone phase shift mask blank for use in manufacturing a halftone phase shift mask which has a transmission portion for transmitting an exposure light, and a phase shifter portion for transmitting a part of the exposure light and for shifting a phase of the transmitted light by a predetermined amount on a transparent substrate, the halftone phase shift mask having an optical property that is designed so as to mutually cancel out the respective transmitted lights in the vicinity of a boundary portion of said transmission portion and the phase shifter portion to thereby keep a contrast of a boundary portion of an exposure pattern transferred onto the surface of a material to be exposed, said blank having a phase shifter film for forming said phase shifter portion on the transparent substrate, wherein said phase shift mask is used in an exposure light wavelength range in the vicinity of a wavelength of 193 nm as an ArF excimer laser, said phase shifter film is constituted of a film containing main elements of silicon, oxygen, and nitrogen, and contains 38 to 45% of silicon, 1 to 40% of oxygen, and 30 to 60% of nitrogen in atomic percentage, and a total amount of these elements is not smaller than 90% in a whole composition constituting said phase shifter film.

4. A halftone phase shift mask blank for use in manufacturing a halftone phase shift mask which has a transmission portion for transmitting an exposure light, and a phase shifter portion for transmitting a part of the exposure light and for shifting a phase of the transmitted light by a predetermined amount on a transparent substrate, the halftone phase shift mask having an optical property that is designed so as to mutually cancel out the respective transmitted lights in the vicinity of a boundary portion of said transmission portion and the phase shifter portion to thereby keep a contrast of a boundary portion of an exposure pattern transferred onto the surface of a material to be exposed, said blank having a phase shifter film for forming said phase shifter portion on the transparent substrate, wherein said phase shift mask is used in an exposure light wavelength range of 140 nm to 200 nm, said phase shifter film is constituted of a film that contains main constituting elements of silicon, oxygen, and nitrogen and that is specified by a real part n and an imaginary part k of a complex refractive index of said phase shifter film with respect to the exposure light, the real part n and the imaginary part k being not smaller than 1.7 and not greater than 0.450, respectively 5. A halftone phase shift mask blank for use in manufacturing a halftone phase shift mask which has a transmission portion for transmitting an exposure light, and a phase shifter portion for transmitting a part of the exposure light and for shifting a phase of the transmitted light by a predetermined amount on a transparent substrate, the halftone phase shift mask having an optical property that is designed so as to mutually cancel out the respective transmitted lights in the vicinity of a boundary portion of said transmission portion and the phase shifter portion to thereby keep a contrast of a boundary portion of an exposure pattern transferred onto the surface of a material to be exposed, said blank having a phase shifter film for forming said phase shifter portion on the transparent substrate, wherein said phase shifter film is constituted of a film containing main elements of silicon, oxygen, and nitrogen, which are adjusted in their amounts to obtain desired optical characteristics for a predetermined exposure light wave between 140 and 200 nm, and an etching stopper film formed between said film and the transparent substrate.

6. The halftone phase shift mask blank according to claim 5 wherein said etching stopper film has a function for adjusting a transmittance.

7. The halftone phase shift mask blank according to claim 5, wherein said etching stopper film is formed by a material which is to be etched with an etchant different from that of the film containing the main elements of silicon, oxygen, and nitrogen.

8. The halftone phase shift mask blank according to claim 5, wherein said etching stopper film is formed by a material which is to be etched with the same etching medium as an etching medium of said film containing the main elements of silicon, oxygen, and nitrogen.

9. The halftone phase shift mask blank according to claim 5, wherein the desired optical characteristics are specified by a transmittance and silicon, oxygen, and nitrogen of the phase shifter film are adjusted to obtain the transmittance between 3 and 40%.

10. The halftone phase shift mask blank according to claim 5, wherein said film containing the main elements of silicon, oxygen, and nitrogen contains 30 to 45% of silicon, 1 to 60% of oxygen, and 5 to 60% of nitrogen in the atomic percentage, and the total amount of these elements is not smaller than 90% in the whole composition constituting said film.

11. A method in which the halftone phase shift mask blank according to claim 1 is manufactured, said method comprising the steps of:
      selecting sputtering gases, such as an inert gas, an oxygen gas, and a nitrogen gas to sputter said film containing the main elements of silicon, oxygen, and nitrogen in a reactive sputtering process; and
      adjusting a ratio of oxygen in said sputtering gas to a range between 0.2 and 30%.

12. A halftone phase shift mask which has a mask pattern constituted of a light transmission portion and a phase shifter portion and obtained by subjecting the phase shifter film in the halftone phase shift mask blank according to claim 1 to a patterning treatment to selectively remove the phase shifter film and to thereby obtain a predetermined pattern.

13. A pattern transfer method in which the halftone phase shift mask according to claim 12 is used to transfer the pattern.

14. A halftone phase shift mask blank for use in manufacturing a halftone phase shift mask which has a transmission portion for transmitting an exposure light, and a phase shifter portion for transmitting a part of the exposure light and for shifting a phase of the transmitted light by a predetermined amount on a transparent substrate, the halftone phase shift mask having an optical property that is designed so as to mutually cancel out the respective transmitted lights in the vicinity of a boundary portion of said transmission portion and the phase shifter portion to thereby keep a contrast of a boundary portion of an exposure pattern transferred onto the surface of a material to be exposed, said blank having a phase shifter film for forming said phase shifter portion on the transparent substrate, wherein said phase shifter film is constituted of first and second layers which are successively deposited on the transparent substrate in order and which are to be continuously etched by the same etching medium;

the second layer being formed by a material unsuitable for detecting an end point of etching in relation to the transparent substrate while the first layer is formed by a material suitable for detecting the end point of etching in relation to the transparent substrate.

15. A halftone phase shift mask blank as claimed in claim 14, wherein a difference in refractive index between the second layer and the transparent substrate is not greater than 0.5 at an end point detection light while a difference in refractive index between the first layer and the transparent substrate is greater at the end point detection light than the above-mentioned difference between the second layer and the transparent substrate.

16. A halftone phase shift mask blank as claimed in claim 14, wherein the phase shifter film has a structure of first and second layers which are successively deposited on the transparent substrate in order;

the first layer being mainly operable to adjust a transmittance while the second layer is mainly operable to adjust a phase.

17. A halftone phase shift mask blank as claimed in claim 14, wherein the first layer is formed by a material selected from a group consisting of Si and MSix (M: at least one element selected from a group consisting of Mo, Ta, W, Cr, Zr, Hf) while the second layer is formed by a material that comprises SiOx, SiOxNy, or M (M: at least one element selected from a group consisting of Mo, Ta, W, Cr, Zr, Hf) together with SiOx, SiOxNy and that is specified by a ratio of M/(Si+M) which is not greater than 0.1.

18. A halftone phase shift mask which has a mask pattern constituted of a light transmission portion and a phase shifter portion and obtained by subjecting the phase shifter film in the halftone phase shift mask blank according to claim 14 to a patterning treatment to selectively remove the phase shifter film and to thereby obtain a predetermined pattern.

19. A pattern transfer method in which the halftone phase shift mask according to claim 14 is used to transfer the pattern.

* * * * *